United States Patent [19]

Sussman et al.

[11] Patent Number: 4,752,816

[45] Date of Patent: Jun. 21, 1988

[54] ELECTRONIC COMPONENT

[75] Inventors: Ricardo S. Sussman; Robert C. Goodfellow, both of Northants, England

[73] Assignee: Plessey Overseas Limited, Ilford, England

[21] Appl. No.: 947,887

[22] Filed: Dec. 30, 1986

Related U.S. Application Data

[63] Continuation of Ser. No. 597,116, Apr. 5, 1984, abandoned.

[30] Foreign Application Priority Data

Apr. 5, 1983 [GB] United Kingdom ................. 8309131

[51] Int. Cl.[4] ...................... H01L 27/14; H01L 23/48
[52] U.S. Cl. ........................................ 357/30; 357/40; 357/56; 357/65
[58] Field of Search ....................... 357/69, 68, 65, 30, 357/56, 40

[56] References Cited

U.S. PATENT DOCUMENTS 4,021,838  5/1977  Warwick ............................... 357/68
4,161,740  7/1979  Frey ..................................... 357/68
4,250,520  2/1981  Denlinger ............................. 357/69

FOREIGN PATENT DOCUMENTS 923221   3/1973  Canada .
0047591  3/1982  European Pat. Off. .
0073149  3/1983  European Pat. Off. .
0042175  3/1982  Japan ..................................... 357/30
2131228  6/1984  United Kingdom .

OTHER PUBLICATIONS

Leheny et al., "An Integrated PIN/FET Photoreceiver for Long Wavelengths Optical Systems", 12/7–9/81, Conference: International Electron Devices Meeting, pp. 276–279.
Aoriuchi et al., "A New LED Structure with a Self-Aligned Sphere Lens for Efficient Coupling to Optical Fibers", Jul. 1977, IEEE Transactions on Electron Devices, vol. ED-24, No. 7, pp. 986–990.

Primary Examiner—James W. Davie
Assistant Examiner—Georgia Y. Epps
Attorney, Agent, or Firm—Fleit, Jacobson, Cohn & Price

[57] ABSTRACT

The electronic component includes a mounting substrate having a surface provided with a plurality of spaced contact pads. A semiconductor chip is mounted on the substrate and includes at least one active element in the form of a photodiode on a substrate of light transmissive material. The active element has a metallized contact region and the semiconductor chip has a plurality of projecting metallized contact regions which are each electrically conductively bonded to a different one of the spaced contact pads of the mounting substrate. The photodiode may be a PIN diode and the semiconductor chips may be an integrated circuit to which the PIN diode is connected thereby providing an optical receiver equivalent to a PIN receiver.

11 Claims, 2 Drawing Sheets

ELECTRONIC COMPONENT

This is a continuation of application Ser. No. 597,116, filed Apr. 5, 1984, now abandoned.

BACKGROUND

This invention relates to an improved electronic component including a semiconductor component mounted on a substrate.

The invention has resulted from a study of the problems involved in the manufacture of substrate entrance detectors. Such detectors are normally mounted on relatively complex packages with an entrance hole for incident illumination. Wire bonding is employed to effect connection to the active mesas. Wire bonding is a common source of device degredation due to both the introduction of additional parasitic capacitances and conductances and enhanced leakage currents. Also yield is low with wire bonding due to high localised pressures involved. It is also difficult to wire bond to mesas smaller than 50 micron diameter imposing restrictions to the reduction in capacitance possible to achieve.

The present invention seeks to provide a construction in which wire bonding to the chip is avoided which is suitable for fabrication of substrate entrance detectors but which has application to other semiconductor devices.

SUMMARY

According to one aspect of the invention there is provided an electronic component comprising a mounting substrate having a surface provided with a plurality of spaced contact pads and a semiconductor chip having at least one active element and a surface provided with projecting metallised contact regions which are superimposed on and electrically conductively bonded to a different one of the contact pads.

By making connection between the chip and mounting substrate by bonding, small area active regions can be employed thereby permitting a reduction in capacitance of the device itself and also obviating the parasitic capacitance and inductance introduced by wire bonding.

The contact pads and associated contact regions may be electrically bonded by thermal compression bonding or by soldering.

A group of the projecting metallised contact regions and associated electrically bonded contact pads may be distributed around the or each active element to support the chip on the substrate. Alternatively, for each active element there may be provided a metallised contact region and associated electrically bonded contact pad which extends at least partially around the element to support the chip on the substrate.

The contact pad(s) associated with an active device may form part of an extended conductor connection. The extended conductor connection may extend to an enlarged connection pad or pads. The mounting substrate may be an integrated circuit with the active element(s) connected into the circuit via the electrical bonding.

The electrical contact regions may be provided on mesas on the chip. A metallised contact region may be provided on the outer face of the semiconductor chip.

The active device may be in the form of a photodiode, e.g. a PIN diode, or a light emitting diode, formed on a substrate of light transmissive semiconductor material. In a particularly advantageous application the diode is a PIN diode and the mounting substrate is part of an integrated circuit including for instance a field effect transistor to which the diode is connected via said electrical bonding. The device may be provided with a cavity in its substrate face opposite the diode junction for receipt of a microlens or optical fibre. A contact pad may be provided on the substrate face of the ship which pad surround the cavity.

BRIEF DESCRIPTION OF THE DRAWINGS

In order that the invention and its various other preferred features may be understood more easily, embodiments thereof will now be described, by way of example only, with reference to the drawings, in which.

DETAILED DESCRIPTION

Figure 1:
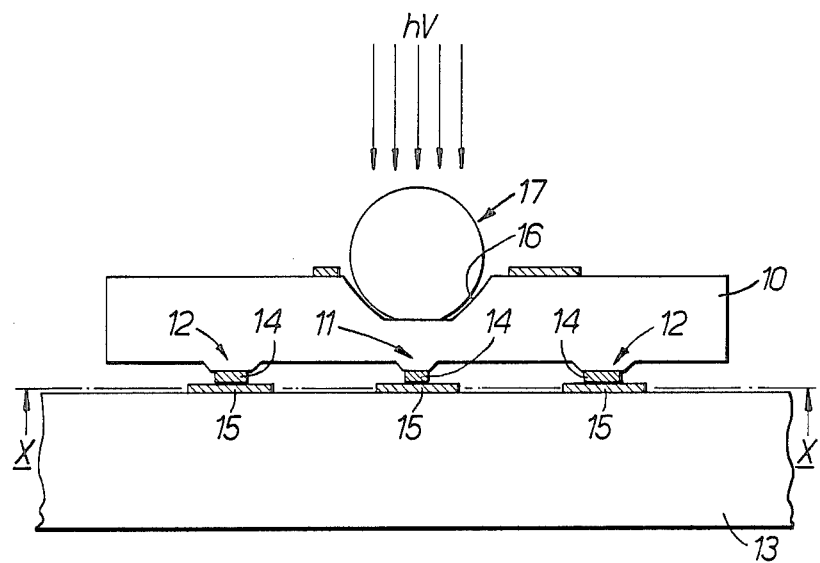
FIG. 1 is a cross sectional view of a substrate entrance detector constructed in accordance with the invention.
Figure 2:
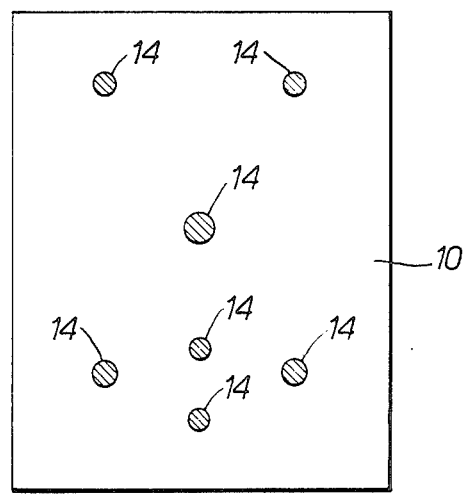
FIG. 2 is a plan view of the mesa side of semiconductor chip forming part of the device of FIG. 1.
Figure 3:
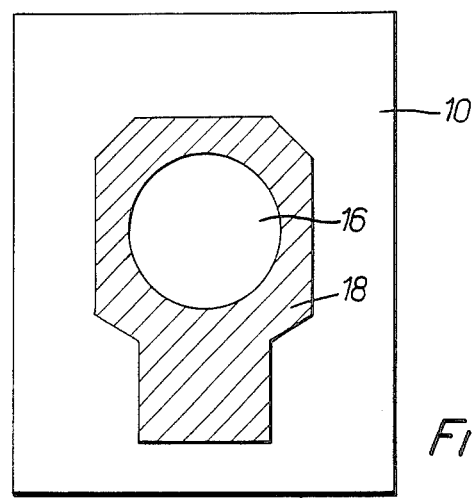
FIG. 3 is a plan view of the opposite side of the semiconductor chip of FIG. 2.
Figure 4:
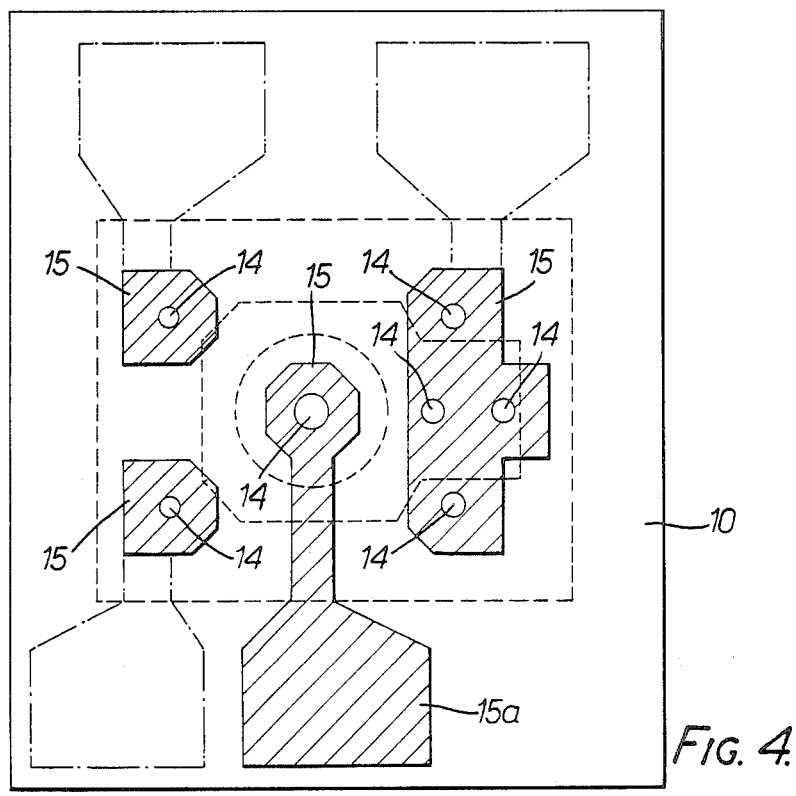
FIG. 4 is a cross sectional view taken on the line x—x of FIG. 1 showing in dotted lines the position of other elements.

Referring now to FIGS. 1 to 4 there is shown an indium phosphide semiconductor chip substrate 10 onto which there is grown an active device in the form of a PIN detector 11. The detector is produced as a diffused or implanted mesa structure on either a ternary (GaInAs) or quaternary (GaInAsP) compound ground lattice matched onto the chip substrate by for example liquid phase epitaxy. Additional mesas 12 are formed which may be identical to the central active mesa or may not have been diffused or implanted so that there is no diode junction at these mesas. The additional mesas 12 are distributed around the pin detector 11 and form an array of supporting legs which provide mechanical stability and support of the chip when mounted on a mounting substrate or carrier block 13. Each of the mesas is provided with a gold metallised contact region 14.

The carrier block 13 can be formed from any insulating material e.g. alumina, ceramics or silica or from a semiinsulating material e.g. gallium arsenide or indium phosphide. The carrier block 13 is provided with gold plated contact pads 15, as can be seen in greater detail in FIG. 4, which are spaced to correspond with the positions of the mesas on the chip 10 so that the chip can be positioned on the block 13 with the metallised contact regions 14 in contact with the contact pads 15. Electrical bonding of the regions 14 to the pads 15 is then effected by thermal compression bonding and the additional mesas 12 serve to reduce the load on the active mesa 11 during the bonding operation.

The pad 15 for the detector 11 is extended (see FIG. 4) to one side of the chip where an enlarged region 15a is provided for lead connection. The pads 15 for the other mesas may also be similarly extended as shown in chain lines in FIG. 4 to provide connection to the chip substrate. If the mesas 12 are provided with a diode, a connection to the substrate may be optionally made by "punching through" the diode i.e. by short circuiting the diode by means of an overcurrent.

The substrate of the chip 10 illustrated is formed from a light transmissive semiconductor material and on the opposite side to the mesas it is provided with an etched well or recess 16 which reduced the thickness and improves light transmission. The recess 16 is in alignment with the detector 11 and enables insertion of a microlens 17 for focusing light onto the detector to increase the light collecting area, or a monomode or lens-tipped multimode optical fibre. Such an arrangement overcomes the disadvantage of existing techniques where an optical fibre in the form of a "pigtail" is permanently attached to the device mounting and which introduces difficulties in integrating the detector into a hybrid package. Also the carrier package can be designed so that parasitic capacitances are only a small fraction of the capacitance of the detector. A gold contact pad 18 (see FIG. 3) is formed on the same side of the chip as the recess 16 and surrounds the recess. This pad permits direct connection to the substrate by wire bonding if required.

A particularly advantageous technique that we have devised to provide a thick gold metallisation on the mesas of the chip is as follows:

1. Provide a thin coating of gold over the entire surface of the chip.
2. Deposit a ring of a delectric material of 2000 Angstrom thickness, e.g. silox, silicon nitride, polyamide, silicon monoxide, to define the required mesa and metal contact dimension.
3. Apply a photoresist and provide a window to expose the inside of the ring.
4. Gold plate to 8-10 micron thickness to provide a projecting contact.
5. Dissolve the photoresist.
6. Apply a gold etch for long enough to remove the thin gold coating but to leave the projecting gold contact substantially intact.
7. Etch the chip to leave a mesa defined by the exterior of the dielectric ring.

An alternative is to deposit the ring onto the chip substrate prior to depositing gold. A similar procedure can be employed using a planar structure with windows for the contacts being provided after production of the active devices by for example diffusion.

In the embodiment described a group of additional mesas 12 are provided around the detector 10. For some applications a single additional mesa may suffice and it will be appreciated that different configurations or patterns of mesa may be employed to suit particular purposes. Examples of suitable patterns are four supporting mesas disposed at the corners of a square configuration with the active mesa disposed centrally within the square or three supporting mesas disposed at the corners of an equilateral triangle with the active mesa disposed centrally within the triangle or where the active mesa is disposed at the centre of a circular pattern of supporting mesas. Examples of suitable configurations of mesa are a single horseshoe shaped pedestal extending part way round the active mesa.

Instead of effecting electrical bonding by thermal compression bonding, the connection may be effected by soldering e.g. employing a low melting point solder and exposing the chip, when positioned on the substrate, to a temperature sufficient to melt the solder.

Although the embodiment described is a diode detector, a light emitting diode could be provided using a similar construction. The concept of the invention is applicable not ony to optical devices but to any semiconductor chip devices where direct bonding enables small area devices or small contact areas to be connected onto a support structure.

Although the embodiment described relates to the provision of a chip on a support block for subsequent wiring to for example a header, the support block 13 may comprise an integrated circuit structure in which case the active device or a number of active devices on the chip 10 are directly electrically bonded to the integrated circuit to form a hybrid circuit. Such an arrangement is considered to fall within the scope of this invention. A particular application of this type is in the manufacture of hybrid PIN - FET circuits for use in receiver circuits. In this case a pin diode would be formed on the chip 10 and an integrated amplifier on the substrate 13. Other applications are possible in integrated optical-/electrical devices, avalanche detectors and in transferred electron devices.

We claim:

1. In an electronic component comprising:
    a mounting substrate having an upper surface provided with a plurality of spaced contact pads; and,
    a semiconductor chip having at least one active element, said semiconductor chip having a plurality of mesa structures on a lower surface thereof, each said mesa structure providing a metallised contact region, said semiconductor chip being mounted on said mounting substrate with each said metallised contact region electrically conductively bonded to a respective one of said spaced contact pads.
    the improvement wherein said semiconductor chip is formed of a light transmissive semiconductor material and said at least one active element comprises a photodiode constituted by one of said mesa structures.

2. An improved electronic component according to claim 1 wherein said semiconductor chip has a well providing a reduced thickness thereof in alignment with said at least one active element to improve the light transmission of said semiconductor chip thereat.

3. An improved electronic component according to claim 1 wherein each said mesa structure provides an active element.

4. An improved electronic component as claimed in claim 1 wherein at least one of said plurality of spaced contact pads forms part of an extended conductor connection.

5. An improved electronic component according to claim 4 wherein said extended conductor connection terminates in an enlarged connection pad.

6. An improved electronic component according to claim 1 wherein said semiconductor chip has an outer face, opposite said lower face, and wherein a metallised contact region is provided on said outer face.

7. An improved electronic component according to claim 1 wherein the electrically conductive bonds between said metallised contact regions and said spaced contact pads are thermal compression bonds.

8. An improved elecronic component according to claim 1 wherein the electrically conductive bonds between said metallised contact regions and said spaced contact pads are solder bonds.

9. An improved electronic component according to claim 1 wherein said mounting substrate is an integrated circuit.

10. An improved electronic component according to claim 9 wherein said photodiode is a PIN photodiode and said PIN photodiode and said integrated circuit together provide an optical receiver.

11. An improved electronic component according to claim 2 further including a microlens disposed in said well.

* * * * *